United States Patent
Hong et al.

(10) Patent No.: US 6,818,970 B1
(45) Date of Patent: Nov. 16, 2004

(54) LEADLESS LEADFRAME PACKAGE DESIGN THAT PROVIDES A GREATER STRUCTURAL INTEGRITY

(75) Inventors: Harry Kam Cheng Hong, Melaka (MY); Hu Ah Lek, Melaka (MY); Santhiran Nadarajah, Melaka (MY); Sharon Ko Mei Wan, Melaka (MY); Chan Peng Yeen, Melaka (MY); Jaime Bayan, Palo Alto, CA (US); Peter Howard Spalding, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/639,226

(22) Filed: Aug. 11, 2003

Related U.S. Application Data

(63) Continuation of application No. 09/724,728, filed on Nov. 28, 2000, now Pat. No. 6,677,667.

(51) Int. Cl.[7] .................................. H01L 23/495
(52) U.S. Cl. .................. 257/666; 257/672; 257/684
(58) Field of Search ............... 257/666, 672, 257/676, 684, 692, 693, 696, 698, 709, 730, 775, 711, 712, 707, 706, 675; 174/524; 361/707

(56) References Cited

U.S. PATENT DOCUMENTS

| | | |
|---|---|---|
| 5,157,475 A | 10/1992 | Yamaguchi |
| 5,157,480 A | 10/1992 | McShane et al. |
| 5,172,214 A | 12/1992 | Castro |
| 5,521,429 A | 5/1996 | Aono et al. |
| 5,656,550 A | 8/1997 | Tsuji et al. |
| 5,783,861 A | 7/1998 | Son |
| 5,835,988 A | 11/1998 | Ishii |
| 5,859,387 A | 1/1999 | Gagnon |
| 5,861,668 A | 1/1999 | Cha |
| 5,886,397 A | 3/1999 | Ewer |
| 5,942,794 A | 8/1999 | Okumura et al. |
| 6,201,292 B1 | 3/2001 | Yagi et al. |
| 6,201,294 B1 | 3/2001 | Lee |
| 6,483,180 B1 | 11/2002 | Bayan et al. |
| 6,677,667 B1 * | 1/2004 | Hong et al. ............ 257/684 |
| 6,686,652 B1 * | 2/2004 | Bayan et al. ........... 257/678 |

* cited by examiner

*Primary Examiner*—Eddie Lee
*Assistant Examiner*—Douglas W. Owens
(74) *Attorney, Agent, or Firm*—Beyer Weaver & Thomas, LLP

(57) ABSTRACT

A leadless leadframe semiconductor package includes a plurality of contacts, at least some of which have integrally formed stems that extend to the peripheral surface of the package. These stems have heights and widths less than the heights and widths of their corresponding contacts. A molded cap encapsulates the stems and the contacts to leave contact surfaces of the contacts exposed on the bottom surface of the package. Another aspect of the invention pertains to a leadless leadframe panel assembly having a conductive substrate panel that has at least one array of device areas, which has a plurality of tie bars and a plurality of contacts. The contacts have integrally formed stems that extend towards and connect to one of the tie bars. The stems have widths and heights that are less than the widths and heights of their corresponding contacts.

22 Claims, 8 Drawing Sheets

LEADLESS LEADFRAME PACKAGE DESIGN THAT PROVIDES A GREATER STRUCTURAL INTEGRITY

CROSS-REFERENCE TO RELATED APPLICATION

This patent application is a continuation of prior application Ser. No. 09/724,728, filed Nov. 28, 2000, now U.S. Pat No. 6,677,667 entitled "Leadless Leadframe Package Design that Provides a Greater Structural Integrity", the content of which is hereby incorporated by reference.

This application is related to U.S. patent application Ser. No. 09/470,826 filed Dec. 23, 1999, and entitled "LEAD FRAME DESIGN FOR BURR-FREE SINGULATION OF MOLDED ARRAY," the content of which is hereby incorporated by reference.

FIELD OF THE INVENTION

The present invention relates generally to the packaging of small-scale integrated circuits. More particularly, the invention relates to leadless leadframe package designs.

BACKGROUND

A leadless leadframe package (LLP) is a relatively new integrated circuit package design that contemplates the use of a metal (typically copper) substrate in the formation of a chip scale package (CSP). As illustrated in FIGS. 1A and 1B, in typical leadless leadframe packages, a copper leadframe strip or panel 10 is patterned to define a plurality of arrays or matrixes 11 of semiconductor device areas 12. Each device area 12 includes a die attach pad 13 and a plurality of contacts 15 disposed about their associated die attach pad 13. Very fine tie bars 16 are used to support the die attach pads 13 and contacts 15.

FIG. 2 illustrates a cross-sectional view of a typical resulting leadless leadframe package 14. The die attach pad 13 supports a die 17 which is electrically connected to its associated contacts 15 by bonding wires 18. A molded cap 20 encapsulates the die 17 and bonding wires 18, and fills the gaps between the die attach pad 13 and the contacts 15 thereby serving to hold the contacts 15 in place. It should be appreciated that during singulation of the individual packages 14, the tie bars 16 are cut and therefore the only materials holding the contacts 15 in place is the molding material. The resulting packaged chip can then be surface mounted on a printed circuit board or other substrate using conventional techniques.

FIG. 3A illustrates a bottom plan, perspective view of an improved leadless leadframe package 14', while FIG. 3B illustrates a fragmentary and enlarged view of one of the contacts 15 and the molding material immediately surrounding the contact 15. In this improved design, an edge portion of each contact 15 has been removed to define a stem 26, which extends from an interior surface 25 of the contact 15 toward a respective peripheral surface 24. The molding material surrounds the stems 26 while leaving a peripheral surface 27 of the stems 26 exposed on the peripheral surfaces 24 of the package 14'. The portion of the molded cap 20 that covers the bottom surface 28 of the stem 26 is indicated by the phantom lines 29, and is referred to as the bar portion 30. These bar portions 30, integrally formed into the molded cap 20, function to lock the contact 15 into the molded cap 20 so that they are not pulled out by the singulating saw blade during the singulation process. Furthermore, the thinned peripheral edges of the contacts 15 reduce stress on the singulating saw blade since it is only required to cut through a smaller amount of metal during the singulation process. For further details, refer to U.S. patent application Ser. No. 09/470,826.

Although the contacts 15 of this package design 14' provide the above-mentioned advantages, the bar portions 30 have been found to occasionally break-away from the molded cap 20 by the frictional forces introduced during singulation. This results in structurally damaged leadless leadframe packages. Consequently, it would be desirable to further improve leadless leadframe package designs to have a greater degree of structural integrity.

SUMMARY

The present invention is directed towards a leadless leadframe package that has a greater degree of structural integrity such that portions of the molded cap do not break off during singulation processes. One aspect of the invention pertains to a leadless leadframe package that has a plurality of contacts, which have contact surfaces on the bottom surface of the package. At least some of the contacts have integrally formed stems that extend outward to the peripheral surface of the package. These stems have heights and widths less than the heights and widths of their corresponding contacts. An integrated circuit die is electrically coupled to at least some of the contacts. A molded cap encapsulates at least a portion of the die, the stems and the contacts. The molded cap leaves the contact surfaces of the contacts exposed on the bottom surface of the package, leaves a peripheral surface of the stems exposed on the peripheral surface of the package, and covers a bottom surface of each of the stems.

Another aspect of the invention pertains to a leadless leadframe panel assembly having a conductive substrate panel that has at least one array of device areas, each array of device areas having a plurality of tie bars and a plurality of contacts. The contacts have contact surfaces on the bottom surface of the leadless leadframe panel assembly. The contacts also have integrally formed stems that extend towards and connect to one of the tie bars. The stems have widths and heights that are less than the widths and heights of their corresponding contacts. A plurality of dice are mounted on the leadframe panel and each die is electrically connected to contacts within an associated device area A molded cap encapsulates at least a portion of each die, the tie bars, the stems and the contacts while leaving the contact surfaces of the contacts exposed and covering a bottom surface of each of the stems.

These and other features and advantages of the present invention will be presented in more detail in the following specification of the invention and the accompanying figures that illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1A:
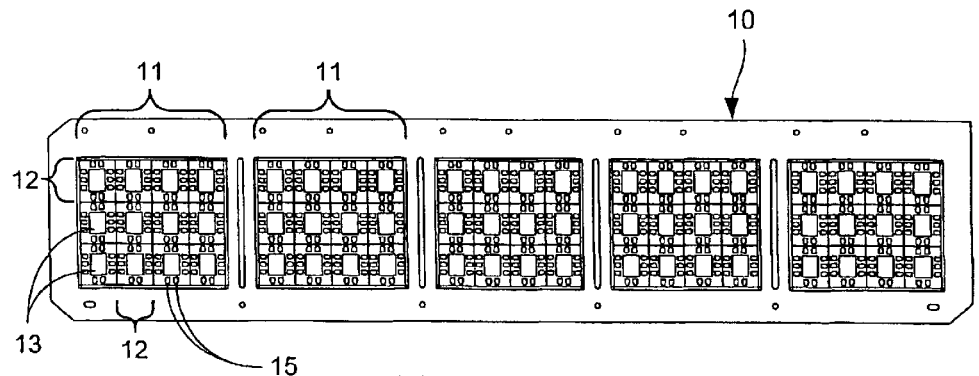
FIG. 1 is a top plan view of a conventional lead frame strip suitable for use in forming leadless leadframe packages.
FIG. 1B is an enlarged top plan view of one end of the lead frame strip of FIG. 1A, illustrating one array of device areas.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The present invention pertains to leadless leadframe packages with improved structural integrity. Specifically, referring now to FIGS. 4A and 4B, the leadless leadframe packages 55 are designed to significantly reduce the breakaway problems of the bar portions 30 of the molded cap 20 occurring during the singulation of the leadframe panels. A leadless leadframe package 55 of the present invention includes a plurality of contacts 15 that each have stems 26 which extend to the peripheral surface 24 of the packages 55. The stems 26 have heights ($H_1$) and widths ($W_1$) less than the heights ($H_2$) and widths ($W_2$) of their respective contacts 15 (See FIGS. 5 and 6). A molded cap 20 encapsulates the contacts 15 such that contact surfaces 47 of the contacts are exposed on the bottom surface 57 of the packages 55. The molded cap 20 also encapsulates the stems 26 such that after singulation a corresponding peripheral surface 27 thereof is exposed at the peripheral surface 24 of the packages 55.

Accordingly, the reduced width dimension ($W_1$) of the stems correspondingly result in a reduced width dimension of the bar portions 30 of the molded cap 55 to cover a bottom surface 28 of the stems 26. Consequently, the reduced width dimension of the molded bar portion 30, versus its transverse cross-sectional dimension (i.e., the length×the height), improve the structural integrity and integral bond thereof to the molded cap 20. Therefore, the bar portions 30 are less likely to break off during the singulation processes. Further, the smaller cross-sectional dimension of the sized stems 26 also reduce wear and tear of the singulating saw blades since the saw blade are required to pass through less metal during the singulation process.

Figure 5:
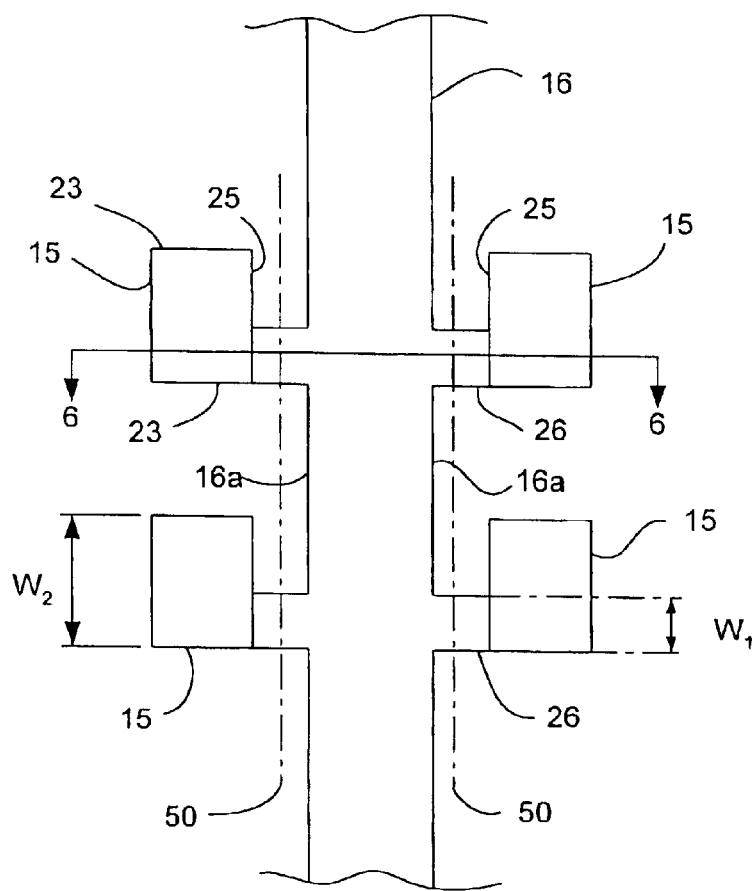
FIG. 5 is a bottom plan, fragmentary view of a tie bar within a leadless leadframe panel according to one embodiment of the present invention.
Figure 6:
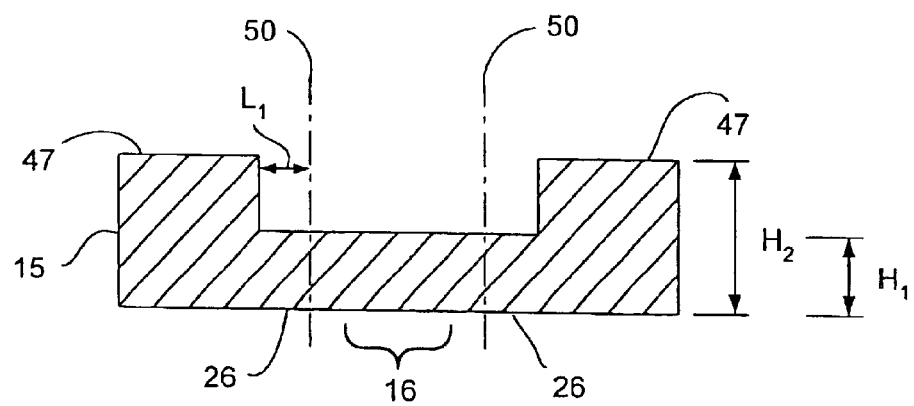
FIG. 6 illustrates a side elevation view of the tie bar in FIG. 5, at a cross-section along the plane of line 6—6.

FIG. 5 illustrates a bottom plan, fragmentary view of a tie bar 16 within a leadless leadframe panel according to one embodiment of the present invention. FIG. 6 illustrates a side elevation view of the tie bar 16 at a cross-section along line 6—6. Electrical contacts 15 are integrally connected to the tie bar 16 through stems 26. The stems 26 have a width ($W_1$) and a height ($H_1$) that is less than the width ($W_2$) and the height ($H_2$) of their corresponding contacts 15. The stems 26 extend from the sidewalls 16a of the tie bar 16 to the contacts 15. Referring to FIG. 5, the tie bar 16 has a height that is substantially equal to the height, $H_1$, of the stems 26. In alternative embodiments, the section of the tie bar 16 between stems 26 on opposing sidewalls 16a of tie bar 16 have heights that are substantially equal to the height of the stems 26, while the remaining portions of the tie bars 16 have heights that are approximately equal to that of the contacts 15. In yet another alternative embodiment, the entire length of the tie bars 16 may have heights equal to that of the contacts 15 leaving only the stems 26 with relatively shorter heights.

In the preferred embodiment, the stems 26 preferably extend from an upper corner of the interior surface 25 of the contacts 15. Thus, the stems 26 are aligned along one of the sidewalls 23 of the contacts 15 and along the upper edge of the interior surface 25 such that a top wall of the stem is substantially co-planar with that of the contact, and a side wall of the stem is substantially co-planar with the sidewall 23 of the contact.

Figure 1B:
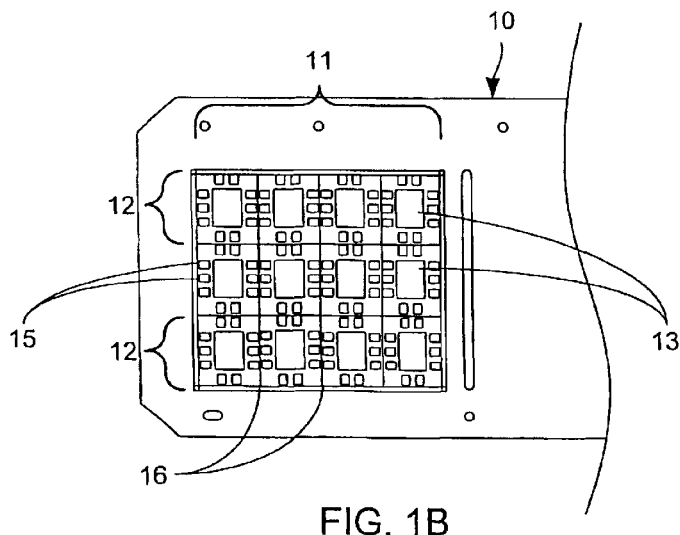
Figure 2:
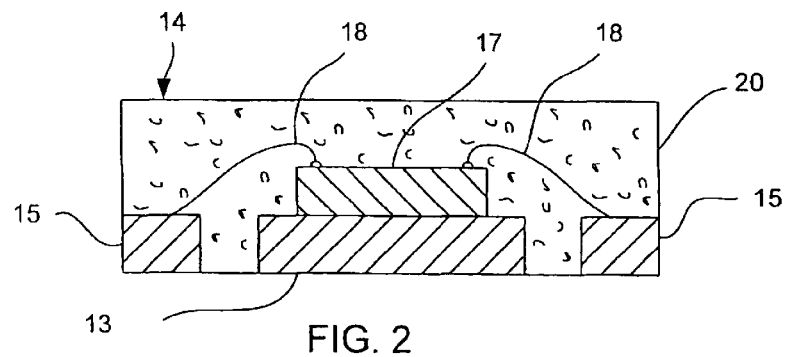
FIG. 2 is a cross-sectional side view of a conventional leadless leadframe package.
Figure 3A:
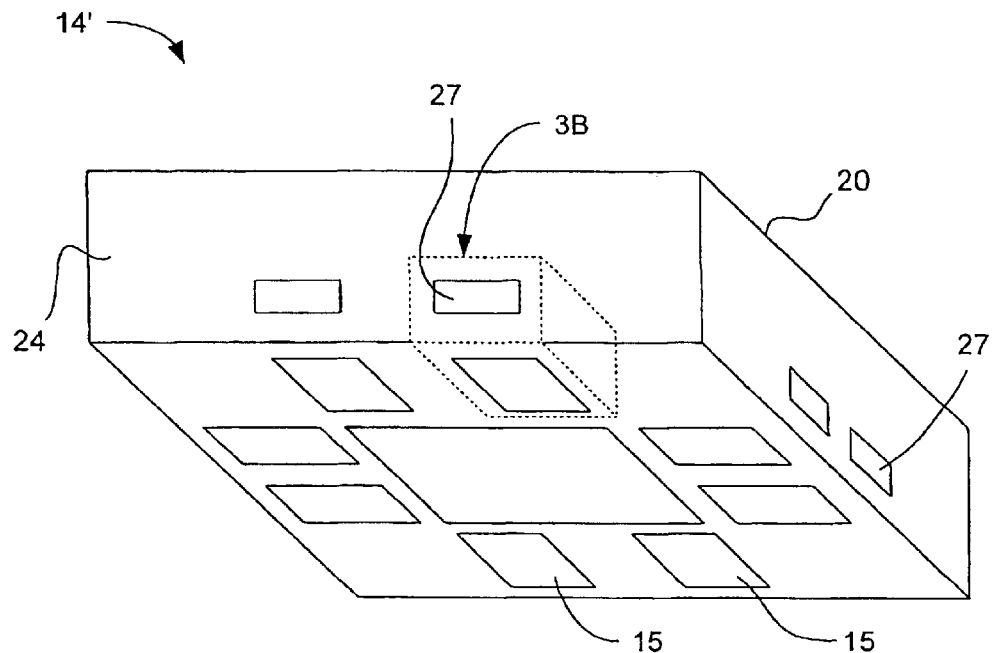
FIG. 3A is a bottom plan, perspective view of an improved leadless leadframe package.
Figure 3B:
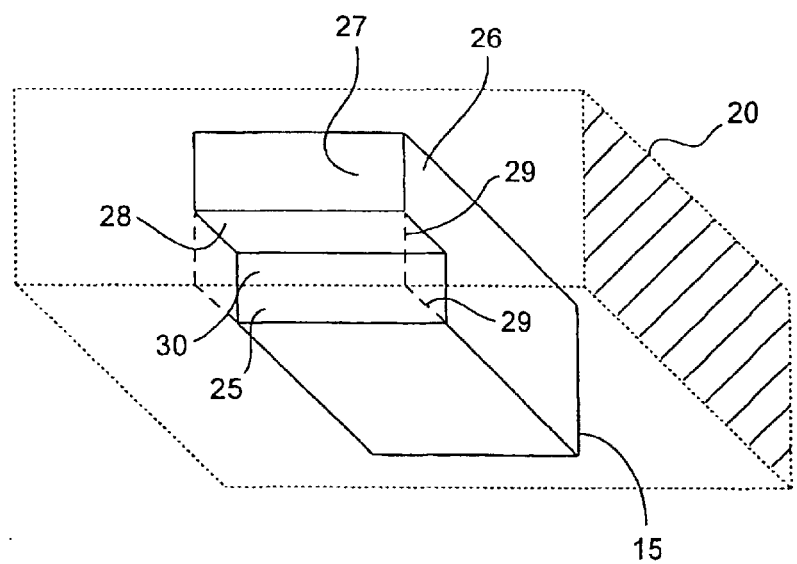
FIG. 3B is an enlarged fragmentary view of a contact within the leadless leadframe package of FIG. 3A, including the molding material immediately surrounding the contact.

Generally, the structural configuration of the contacts, tie bars and stems are formed by selectively etching the leadless leadframe panel, such as panel 10 in FIGS. 1A and 1B. Other conventional fabrication techniques may be employed however. Once the leadless leadframe panel has been properly etched, briefly, semiconductor dice (not shown) are attached to the panel, and connected to the contacts 15 with electrical connectors (not shown). The encapsulation cap 20 is then formed through flood molding techniques or the like. Upon application of the molding material, at least a portion of the dice, the connectors, the tie bars and the contacts are encapsulated therein. As best viewed in FIGS. 4A and 4B, the molding material further surrounds the stems 26, while the bottom or contact surfaces 47 of the contacts 15 remain exposed at the bottom surface of the packaged device. These exposed surfaces of the contacts form connection points to an electrical substrate (not shown). The individual semiconductor device packages are then singulated from the panel by passing a singulating saw blade in the path of phantom lines 50. As the saw blade passes along phantom lines 50, the tie bar 16 and part of the stems 26, in the path of the blade, are essentially removed. Therefore, the resulting packages have stems 26 with lengths ($L_1$).

Figure 4A:
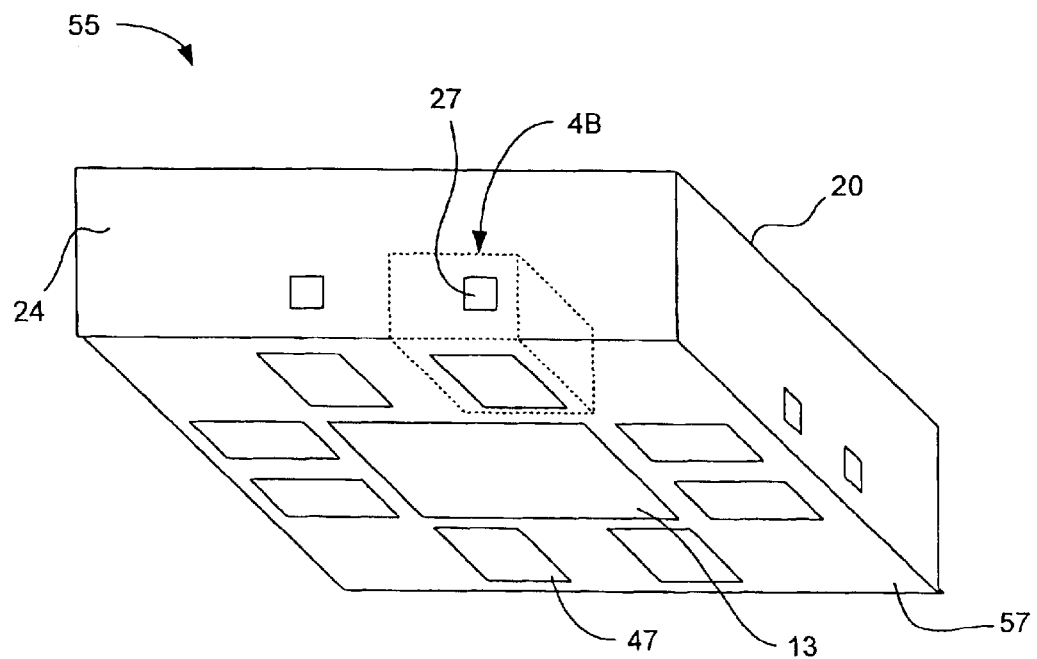
FIG. 4A illustrates a perspective view of the bottom of a packaged semiconductor device according to one embodiment of the present invention.
Figure 4B:
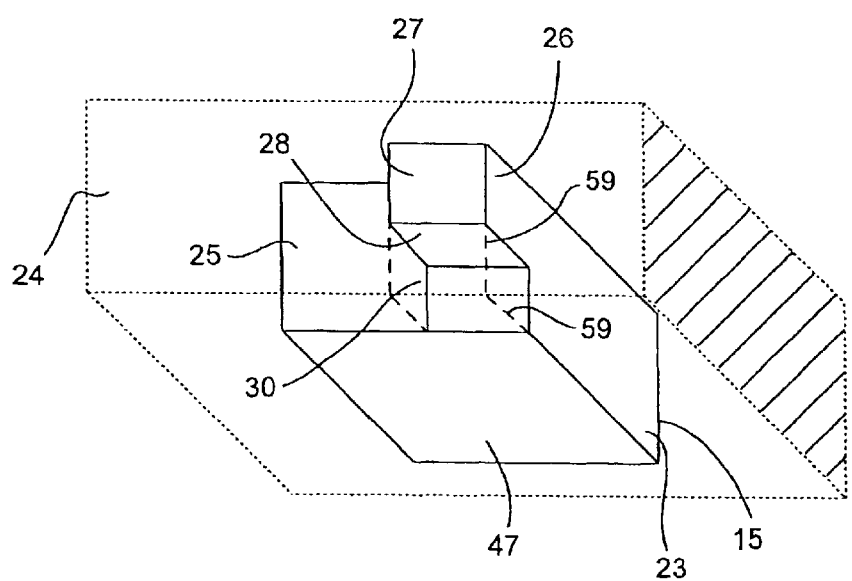
FIG. 4B is an enlarged fragmentary view of a contact within the leadless leadframe package of FIG. 4A, including the molding material immediately surrounding the contact.

The singulation process exposes the peripheral surfaces 27 of the stems 26, as well as peripheral surface 24 of the package 55 (FIGS. 4A and 4B). The contact surfaces 47 of the contacts 15 and the die attach pad 13 are also exposed on the bottom surface 57 of the package 55. These contact surfaces 47 are further offset from the peripheral surfaces 24 of the package 55 and the peripheral surfaces 27 of the stems 26 are offset from the bottom surface 57 of the package 55.

FIG. 4B illustrates a fragmentary, perspective view of one of the contacts 15 and the molding material that immediately surrounds the contact 15. The phantom lines 59 designate the bar portion 30 of the molded cap 20 that covers the bottom surface 28 of the stems 26. The width dimension ($W_1$) of the stems 26 are significantly reduced (versus the length ($L_1$) and height ($H_1$)) so that the relative structural integrity between the corresponding bar portions 30, the interior surface 25 of the contacts, stems and molded cap 20 are improved. Consequently, the frictional forces induced by singulating saw blade during singulation are less likely to breakaway and separate bar portion 30 from the package 55.

In the present invention, the widths ($W_1$) of the stems 26 are one of the primary stem dimension components which dictate the structural integrity between the integral bar portions 30 and the molded cap 20. The wider the stem dimensions, the wider the resulting bar portions 30, which correspondingly exposes a greater amount of the bar portions' surface area to the singulating saw blade. Wider bar portions are therefore more vulnerable to pull out during singulation.

The width of the stems 26 may be varied depending upon the design requirements of each package. The stem heights also affect the integrity of the bar portions 30. Taller stems decrease the bar portion heights and thereby, the bar portion surface areas. Therefore, the stem heights may also be varied to obtain different degrees of structural integrity. Stem length affects the integrity of the bar portions 30 even though the surface area of the bar portions is not affected. Longer stems result in longer bar portions 30, which allow the bar portions to be integrally connected to the molded cap through larger connection points. Longer stems therefore allow bar portions to exhibit greater structural integrity.

Therefore, the relative structural integrity between the bar portions 30 and the molded cap 20 can be altered by varying the dimensions of the stems 26. The bar portions 30 have the greatest amount of structural integrity when the stems 26 are sized such that the length, width and height of the bar portions are substantially equal, e.g., cubical in shape. It should be noted, however, that the dimensions of the stems 26 should not be so small that they would not be able to properly support the corresponding contacts 15 in the leadframe panel. Currently the width of stems 26 should not be less than approximately 0.004 inches. However, as technological advances enable the size and weight of the contacts to diminish, the width of the stems may correspondingly be sized less than 0.004 inches.

Figure 7:
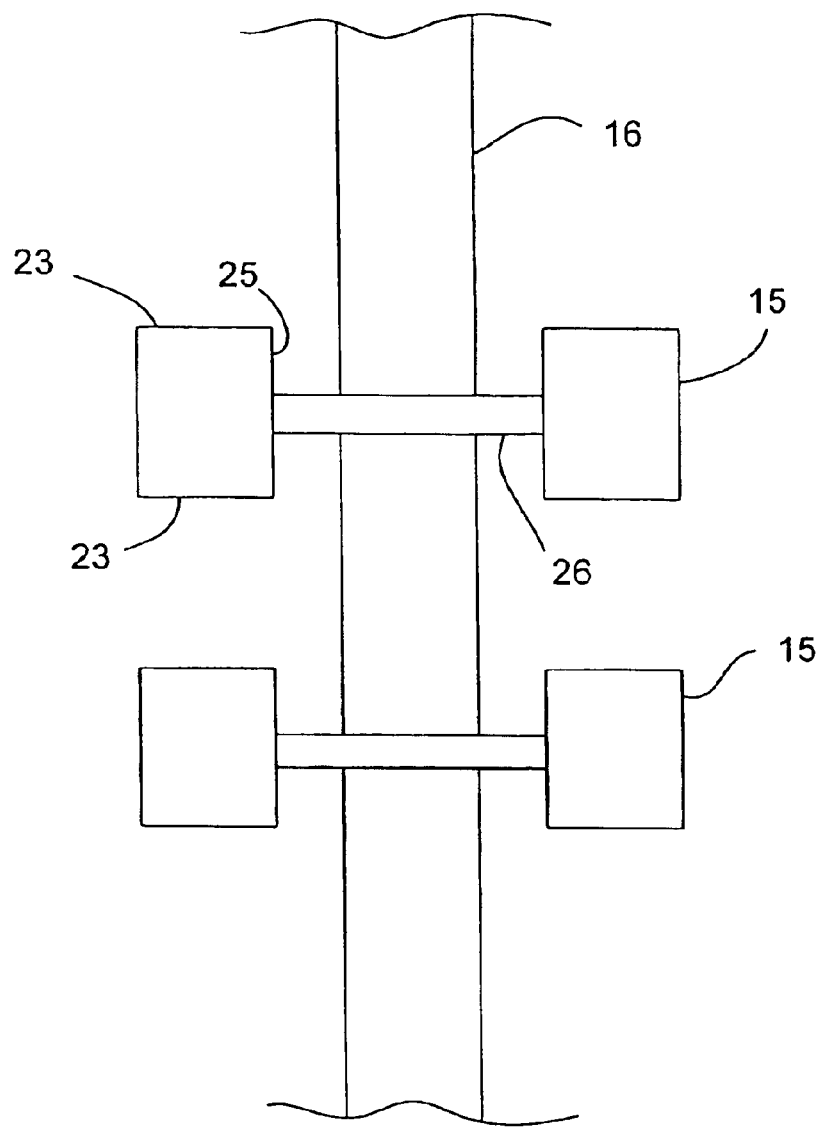
FIG. 7 is a bottom plan, fragmentary view of a tie bar within a leadless leadframe panel according to an alternative embodiment of the present invention.
Figure 8A:
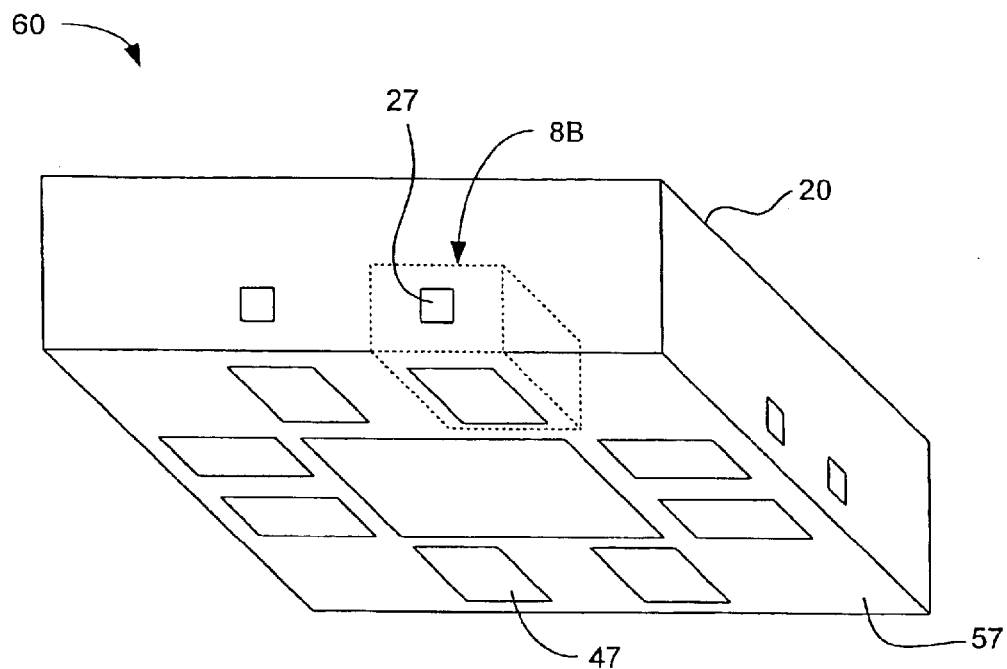
FIG. 8A illustrates a perspective view of the bottom of a packaged semiconductor device that results from a leadless leadframe panel having a structure as illustrated in FIG. 7.
Figure 8B:
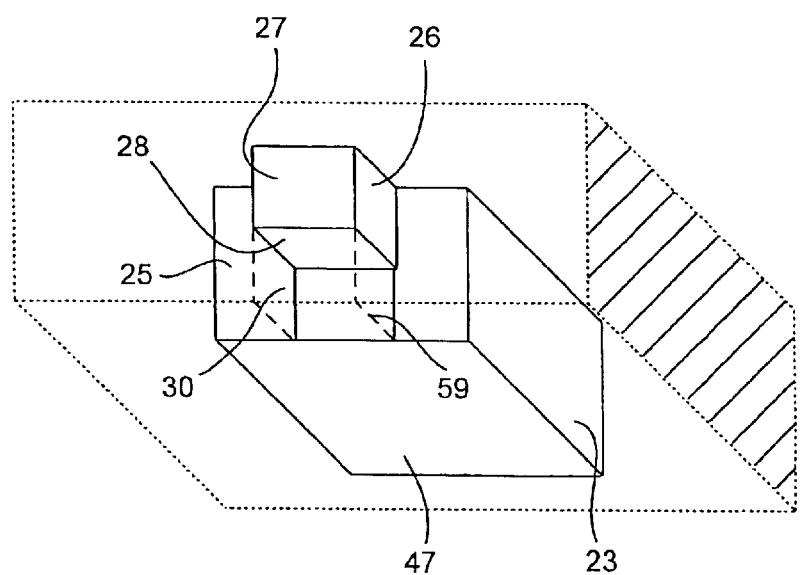
FIG. 8B is an enlarged fragmentary view of a contact within the leadless leadframe package of FIG. 8A, including the molding material immediately surrounding the contact.

It should be noted that the stem 26 can be formed to extend from various positions on the interior surface 25 of the contacts 15, so long as they are offset from the bottom surface 47 of the contacts 15. For instance, as shown in FIGS. 7–8B, the stems 26 extend from a position that is offset from both of the sidewalls 23. In this embodiment, the stems preferably extend from the center of the contact interior surface 25, and are aligned such that the top wall of the stem is substantially co-planar with that of the contact. Similar to the previous arrangements, the relative structural integrity between the bar portions 30 and the molded cap 20 can be altered by varying the dimensions of the stems 26.

Figure 9:
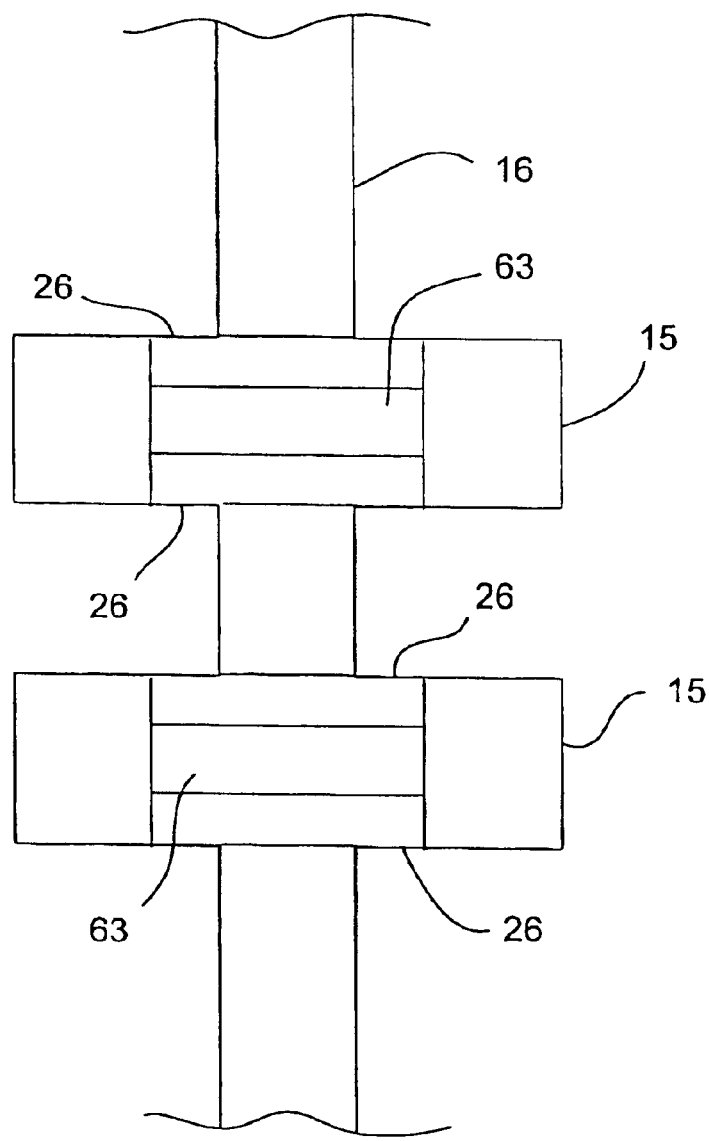
FIG. 9 is a bottom plan, fragmentary view of a tie bar within a leadless leadframe panel according to yet another alternative embodiment of the present invention.
Figure 10A:
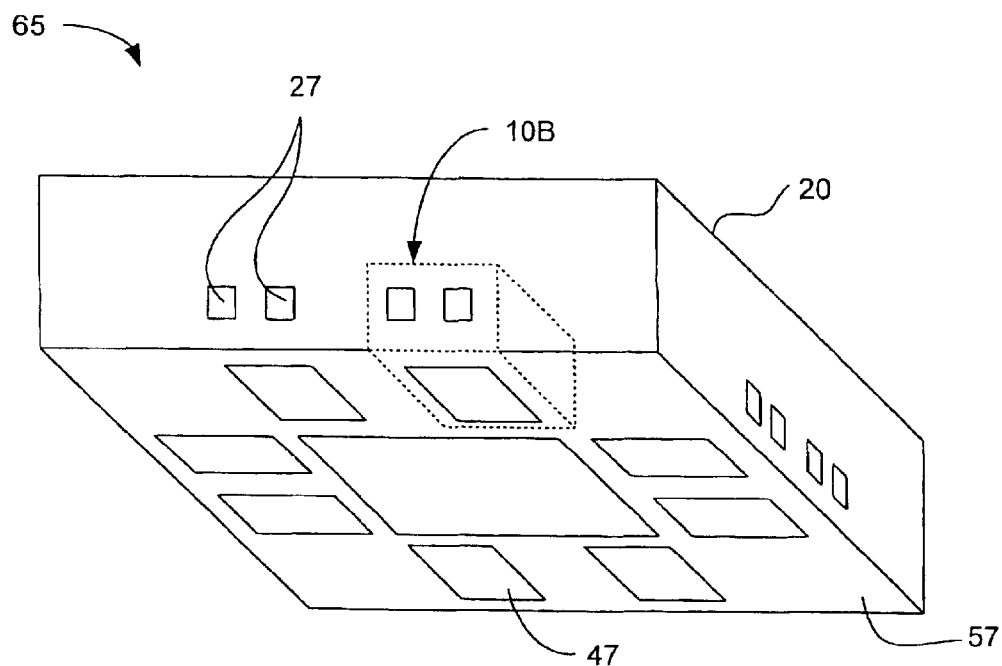
FIG. 10A illustrates a perspective view of the bottom of a packaged semiconductor device that results from a leadless leadframe panel having a structure as illustrated in FIG. 9.
Figure 10B:
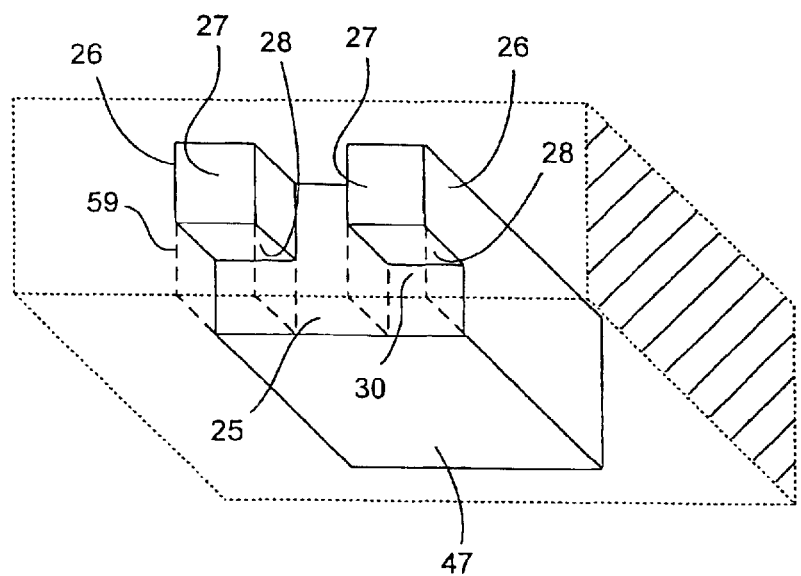
FIG. 10B is an enlarged fragmentary view of a contact within the leadless leadframe package of FIG. 9, including the molding material immediately surrounding the contact.

Referring now FIGS. 9–10B, yet another alternative embodiment of the leadless leadframe panel is illustrated having a pair of stems 26 supporting each respective contact 15 to the tie bar 16. The stems 26 preferably extend from the outer edges of the contacts 15 such that an open channel 63 passes from the top surface to the bottom surface of the stems 26 and tie bars 16. FIG. 10A illustrates a bottom plan, perspective view of a packaged device 65 resulting from a leadless leadframe panel having a structure as shown in FIG. 9. FIG. 10B illustrates a fragmentary, perspective view of a contact 15 within the packaged device, including the portion of the molded cap immediately surrounding the contact, in FIG. 8A. The two stems 26 of each contact 15 are each surrounded by molding material of the molded cap 20 such that a bar portion 30 covers the bottom surface of each stem 26.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A leadless leadframe panel assembly having a top and a bottom surface comprising:
    a conductive substrate panel having at least one array of device areas, each array of device areas having a plurality of tie bars and a plurality of contacts, the contacts having contact surfaces on the bottom surface of the leadless leadframe panel assembly, the contacts also having integrally formed stems that extend towards and connect to one of the tie bars, the stems each having a width and height that are less than a width and height of their corresponding contacts.

2. A leadless leadframe panel assembly as recited in claim 1 wherein at least one contact includes an interior surface, and said stem extending from the respective interior surface.

3. A leadless leadframe panel assembly as recited in claim 2 wherein the stem is offset from a bottom edge of the interior surface.

4. A leadless leadframe panel assembly as recited in claim 2 wherein the stem of the one contact further extends from a side wall thereof.

5. A leadless leadframe panel assembly as recited in claim 4 wherein said stem further extends from an upper corner of the interior surface of the one contact.

6. A leadless leadframe panel assembly as recited in claim 2 wherein the interior surface of the one contact is positioned between opposed side walls thereof, and the stem is positioned offset from said opposed side walls.

7. A leadless leadframe panel assembly as recited in claim 6 wherein the stern extends from an upper edge of the interior surface.

8. A leadless leadframe panel assembly as recited in claim 1 wherein the stem is generally rectangular-shaped.

9. A leadless leadframe panel assembly as recited in claim 1 wherein the stem is generally the shape of a three-dimensional cube.

10. A leadless leadframe panel assembly as recited in claim 1 wherein the width of each stem is at most about one-half the width of each corresponding contact.

11. A leadless leadframe panel assembly as recited in claim 1 wherein the height of each stem is at most about one-half the height of each corresponding contact.

12. A leadless leadframe panel assembly as recited in claim 1 wherein the width and height of each stem is approximately one-third to one-half the width and height, respectively, of each corresponding contact, and the minimum length of each stem is approximately 0.003 inches.

13. A leadless leadframe panel assembly as recited in claim 1 wherein at least one contact includes one stem that extends toward the tie bars along an axis perpendicular to a corresponding contact surface.

14. A leadless leadframe panel assembly as recited in claim 13 wherein the stem has a width and height on a plane perpendicular to the axis that are less than a width and height of the corresponding contact.

15. A leadless leadframe panel assembly having a top and a bottom surface comprising:

a conductive substrate panel having at least one array of device areas, each array of device areas having a plurality of tie bars and a plurality of contacts, the contacts having contact surfaces on the bottom surface of the leadless leadframe panel assembly, wherein the contacts also have integrally formed first stems that extend towards and connect to one of the tie bars, the first stems each having a width and height that are less than a width and height of their corresponding contacts; and wherein at least one of the contacts includes a second integrally formed stem that extends towards and connects to one of the tie bars, the second stem having a width and a height that is less than the width and height of the one contact.

16. A leadless leadframe panel assembly as recited in claim 15 wherein at least one contact includes an interior surface, and said first and second stems extending from the respective interior surface.

17. A leadless leadframe panel assembly as recited in claim 16 wherein the first stems and the second stems are offset from a bottom edge of the interior surface.

18. A leadless leadframe panel assembly as recited in claim 16 wherein the first stems and the second stems extend from an upper edge of the interior surface.

19. A leadless leadframe panel assembly as recited in claim 18 wherein the first stems and the second stems extend from opposite corners on the upper edge of the interior surface.

20. A leadless leadframe panel assembly as recited in claim 15 wherein the first stems and the second stems are generally rectangular-shaped.

21. A leadless leadframe panel assembly as recited in claim 15 wherein at least one contact includes first and second stems that extend towards the tie bars along an axis perpendicular to a corresponding contact surface.

22. A leadless leadframe panel assembly as recited in claim 21 wherein the first and second stems each has a width and height on a plane perpendicular to the axis that are less than a width and height of their corresponding contact.

* * * * *

UNITED STATES PATENT AND TRADEMARK OFFICE
CERTIFICATE OF CORRECTION

PATENT NO. : 6,818,970 B1  Page 1 of 1
DATED : November 16, 2004
INVENTOR(S) : Hong et al.

It is certified that error appears in the above-identified patent and that said Letters Patent is hereby corrected as shown below:

Column 6,
Line 55, change "the stern" to -- the stem --.

Signed and Sealed this

Nineteenth Day of April, 2005

JON W. DUDAS
*Director of the United States Patent and Trademark Office*